(12) United States Patent
Qu

(10) Patent No.: US 11,048,032 B2
(45) Date of Patent: Jun. 29, 2021

(54) MANUFACTURING METHOD FOR METAL GRATING, METAL GRATING AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventor: Lianjie Qu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 246 days.

(21) Appl. No.: 15/937,748

(22) Filed: Mar. 27, 2018

(65) Prior Publication Data
US 2019/0041563 A1 Feb. 7, 2019

(30) Foreign Application Priority Data
Aug. 1, 2017 (CN) .......................... 201710648516.0

(51) Int. Cl.
| | |
|---|---|
| *G02B 5/30* | (2006.01) |
| *G02F 1/1335* | (2006.01) |
| *C23F 4/00* | (2006.01) |
| *H01L 51/52* | (2006.01) |

(52) U.S. Cl.
CPC .......... *G02B 5/3041* (2013.01); *G02B 5/3058* (2013.01); *G02F 1/133528* (2013.01); *C23F 4/00* (2013.01); *G02F 1/133548* (2021.01); *G02F 1/133565* (2021.01); *G02F 2201/30* (2013.01); *H01L 51/5281* (2013.01)

(58) Field of Classification Search
CPC ................ G02B 5/3058; G02B 5/3041; C23C 16/45525; G02F 1/133548
USPC ..................................................... 427/163.1
See application file for complete search history.

(56) References Cited

U.S. PATENT DOCUMENTS

| | | | | |
|---|---|---|---|---|
| 2012/0031487 A1* | 2/2012 | Kuang | ................ | H01L 51/0023 136/256 |
| 2014/0192409 A1* | 7/2014 | Yamaguchi | .............. | G02B 5/30 359/485.05 |
| 2015/0279688 A1* | 10/2015 | Cok | ........................ | G02B 5/001 359/485.05 |

* cited by examiner

*Primary Examiner* — Elizabeth A Burkhart
(74) *Attorney, Agent, or Firm* — Womble Bond Dickinson (US) LLP

(57) ABSTRACT

The present disclosure relates to a manufacturing method for a metal grating, a metal grating, and a display device. In this manufacturing method, after forming a plurality of parallel grating strips by means of an adhesive film layer, a metal thin film with a uniform thickness is formed over the plurality of grating strips and gaps between the grating strips. Furthermore, a metal grating is formed by performing topping treatments on both of an upper surface and a lower surface of the resulting structure.

9 Claims, 6 Drawing Sheets

MANUFACTURING METHOD FOR METAL GRATING, METAL GRATING AND DISPLAY DEVICE

CROSS REFERENCE TO RELEVANT APPLICATION(S)

The present application claims the priority of the Chinese patent application No. 201710648516.0 filed on Aug. 1, 2017, the entire disclosure of which is incorporated herein by reference.

TECHNICAL FIELD

The present disclosure relates to the field of display technologies, and in particular to a manufacturing method for a metal grating, a metal grating, and a display device.

BACKGROUND ART

At present, in a flat panel display, for fabricating a built-in polarizer, a dichroic dye is usually used as a main component of the polarizer, and applied inside a liquid crystal cell by spin-coating, so as to form the built-in polarizer. Due to limitations of the material, a polarizer formed in this way has only a polarization degree of 80%, which is far from the polarization degree of 99.99% as required by a display panel. Therefore, it cannot be applied in an actual product.

As an alternative formation approach, the built-in polarizer can also be formed by nano-imprinting. However, the nano-imprinting procedure has a lower yield rate and involves more complicated processes. This results in a higher fabricating cost and greater development difficulty. Besides, during the nano-imprinting procedure, the product yield rate drops rapidly as the resolution rises.

SUMMARY

According to one aspect of the present disclosure, a manufacturing method for a metal grating is provided in an embodiment. Specifically, the manufacturing method comprises: forming a peeling layer and an adhesive film layer sequentially on a base substrate; etching the adhesive film layer to form a plurality of grating strips parallel to each other; forming a metal thin film covering the plurality of grating strips and gaps between the grating strips, the metal thin film having a uniform thickness; covering the metal thin film with a filling material; performing a first topping process on the resulting structure, such that an exposed surface comprises grating strips, metal strips and filling strips arranged alternately and flush with each other; forming a base layer over the grating strips, the metal strips and the filling strips; peeling the base substrate by removing the peeling layer; and after flipping over, performing a second topping process on the resulting structure, such that an exposed surface comprises grating strips, metal strips and filling strips arranged alternately and flush with each other, thereby forming a metal grating.

According to a possible implementation, in the manufacturing method provided by an embodiment of the present disclosure, the thickness of the metal thin film is smaller than half of a pitch between adjacent grating strips.

According to a possible implementation, in the manufacturing method provided by an embodiment of the present disclosure, the width of each grating strip is smaller than the pitch between adjacent grating strips.

According to a possible implementation, in the manufacturing method provided by an embodiment of the present disclosure, the width of each grating strip is equal to that of each filling strip.

According to a possible implementation, in the manufacturing method provided by an embodiment of the present disclosure, the metal thin film covering the plurality of grating strips and the gaps between the grating strips is formed by atomic layer deposition or ion-assisted deposition.

According to a possible implementation, in the manufacturing method provided by an embodiment of the present disclosure, the filling material comprises a resin material with fluidity.

According to a possible implementation, in the manufacturing method provided by an embodiment of the present disclosure, during the first topping process, tops of the metal thin film and the filling material are removed simultaneously by dry etching.

According to a possible implementation, in the manufacturing method provided by an embodiment of the present disclosure, after the first topping process and prior to the second topping process, every two adjacent metal strips are connected with each other at one end via a metal thin film part.

According to a possible implementation, in the manufacturing method provided by an embodiment of the present disclosure, during the second topping process, tops of the grating strips, the metal strips and the filling strips, as well as the metal thin film parts, are removed simultaneously by dry etching.

According to a possible implementation, the manufacturing method provided by an embodiment of the present disclosure further comprises: forming a planarization layer over the metal grating.

According to another aspect of the present disclosure, a metal grating manufactured by the above manufacturing method is further provided in an embodiment. Specifically, the metal grating comprises: a base layer; a plurality of metal strips arranged on the base layer and parallel to each other; and grating strips and filling strips arranged alternately between adjacent metal strips.

According to a possible implementation, the metal grating provided by an embodiment of the present disclosure further comprises: a planarization layer arranged over the metal strips, the grating strips and the filling strips.

According to yet another aspect of the present disclosure, a display device is further provided in an embodiment. Specifically, the display device comprises: a display panel; and the metal grating arranged inside the display panel as a polarizer.

According to a possible implementation, in the display device provided by an embodiment of the present disclosure, the display panel is a liquid crystal display panel. Specifically, the liquid crystal display panel comprises: a counter substrate and an array substrate arranged opposite to each other; a liquid crystal layer arranged between the counter substrate and the array substrate; and the metal grating as mentioned above. The metal grating specifically comprises: a first metal grating arranged on one side of the array substrate facing the liquid crystal layer; and a second metal grating arranged on one side of the counter substrate facing the liquid crystal layer, wherein an extension direction of the first metal grating is perpendicular to that of the second metal grating.

According to a possible implementation, in the display device provided by an embodiment of the present disclosure, the display panel is an organic electroluminescent display panel. Specifically, the organic electroluminescent display panel comprises: a base substrate; a light emitting device arranged on the base substrate; an encapsulation layer covering the light emitting device; the metal grating layer as mentioned above; and a quarter-wave plate. The metal grating is arranged between the encapsulation layer and the light emitting device, and the quarter-wave plate is arranged between the light emitting device and the metal grating.

DETAILED DESCRIPTION OF THE EMBODIMENTS

Figure 1:
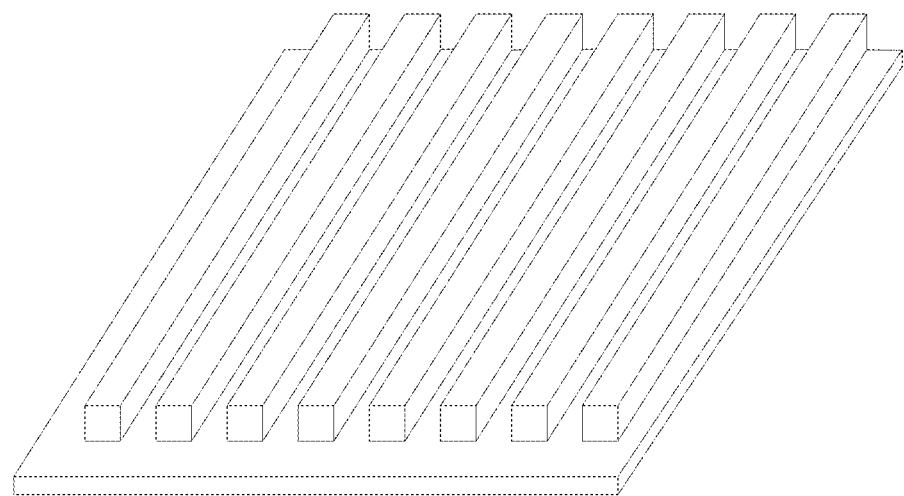
FIG. 1 is a schematic structure view for a typical metal grating.

Specific implementations of the manufacturing method for a metal grating, the metal grating and the display device provided in embodiments of the present disclosure will be described below in detail with reference to the drawings.

In the drawings, thicknesses and shapes of each thin film do not reflect the real ratio of the metal grating. But instead, they are only provided to illustrate contents of the present disclosure schematically.

Figure 2A:
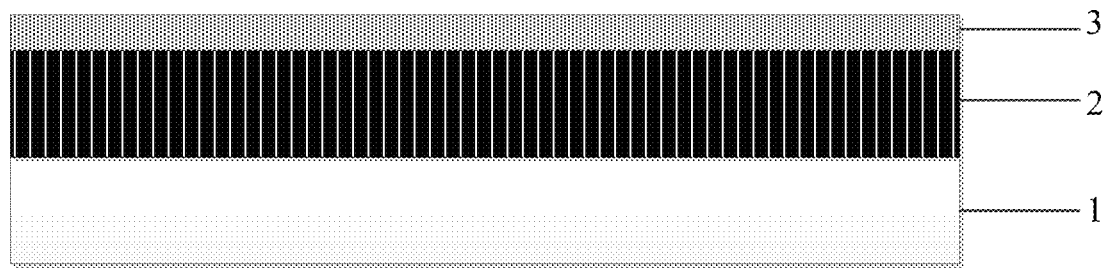
FIGS. 2a-2d are respectively schematic views for a structure at different stages during the manufacture of a metal grating by nano-imprinting.
Figure 2B:
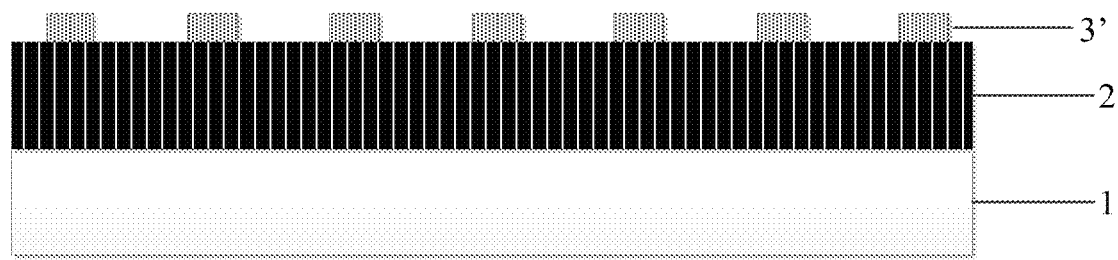
Figure 2C:
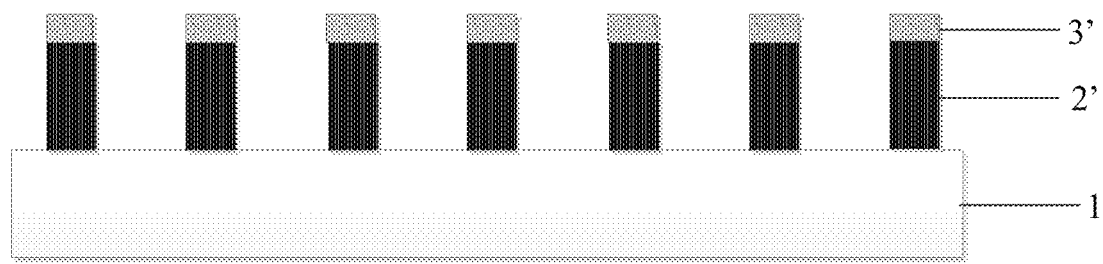
Figure 2D:
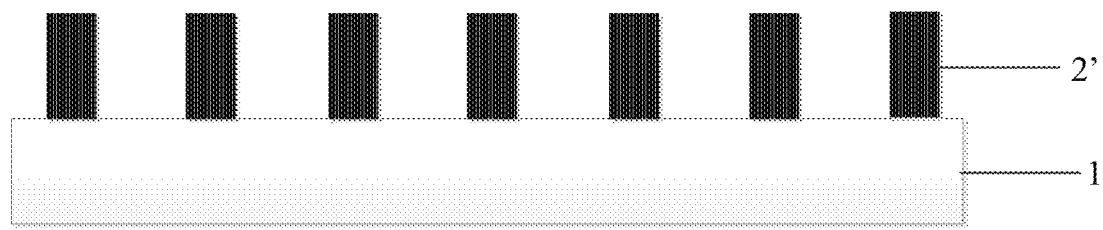

Referring to FIG. 1, a schematic structure view for a typical metal grating is shown. Specifically, as shown in FIG. 1, the metal grating can be used as a built-in polarizer inside a display device. Next, the manufacturing process for the metal grating shown in FIG. 1 will be described in detail with reference to FIG. 2. As an example, the manufacturing process can comprise steps of: (1) as shown in FIG. 2a, depositing a metal film 2 on a base 1 and continuing to apply an adhesive film 3; (2) as shown in FIG. 2b, patterning the adhesive film 3 by exposure or nano-imprinting, so as to form a shielding pattern 3'; (3) as shown in FIG. 2c, subjecting the metal film 2 to a nanoscale high-resolution etching with shielding by the shielding pattern 3', thereby forming a metal grating 2'; and (4) as shown in FIG. 2d, removing the residual shielding pattern 3'.

When a metal grating with a period of 120 nm is manufactured by the above manufacturing method, only a 3-inch sample can be obtained due to the poor yield rate of nano-imprinting. This is particularly true for large-sized products, and thus is disadvantageous for applications in large-sized display panels. Moreover, a nano-imprinting procedure has a lower yield rate, and involves more complicated processes. So, the cost of templates is high, and the development is difficult. Besides, the nano-imprinting procedure belongs to a contact type of mechanical manufacture, which has high requirements for the smoothness of substrate.

Figure 3:
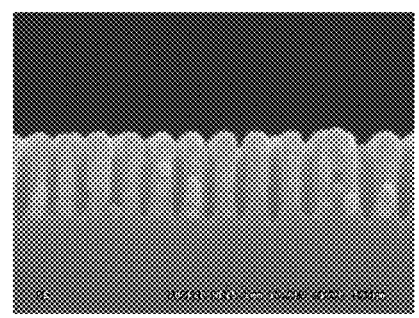
FIG. 3 is an actual structure view for a metal grating manufactured by nano-imprinting.

Besides, a high-resolution metal grating is a huge challenge to the existing processes and devices. At present, the exposure can only reach the order of 1 μm, and cannot achieve resolution of 0.1 μm. Although the nano-imprinting procedure can barely reach the order of 100 nm at present, the product yield rate drops rapidly as the resolution rises. There is no mature process solution for that. So, nano-imprinting can only stagnate on low resolution for the time being. Apart from the difficulty for forming nanoscale patterns, another problem lies in etching the metal grating. A currently available etching device basically does not have homogeneity reaching the order of nanometers. So, the patterns formed are irregular. This can be seen clearly in FIG. 3.

In view of above, how to manufacture an erodible metal grating having high resolution and high yield rate is an urgent technical problem to be solved in the art.

Figure 4:
FIG. 4 is a flow diagram of a manufacturing method for a metal grating according to an embodiment of the present disclosure.

To this end, a new manufacturing method for a metal grating is provided in an embodiment of the present disclosure. As shown in FIG. 4, the manufacturing method specifically comprises steps of: S401, forming a peeling layer and an adhesive film layer sequentially on a base substrate; S402, etching the adhesive film layer to form a plurality of grating strips parallel to each other; S403, forming a metal thin film covering the plurality of grating strips and gaps between the grating strips, the metal thin film having a uniform thickness, wherein the thickness d of the metal thin film is optionally smaller than half of a pitch a between adjacent grating strips; S404, covering the metal thin film with a filling material; S405, performing a first topping process on the resulting structure, such that an exposed surface comprises grating strips, metal strips and filling strips arranged alternately and flush with each other; S406, forming a base layer over the grating strips, the metal strips and the filling strips; S407, peeling the base substrate by removing the peeling layer; and S408, after flipping over, performing a second topping process on the resulting structure, such that an exposed surface comprises grating strips, metal strips and filling strips arranged alternately and flush with each other.

Specifically, according to the manufacturing method for a metal grating provided by an embodiment of the present disclosure, after a plurality of grating strips are formed in parallel by an adhesive film layer, a metal thin film distributed continuously with a uniform thickness is formed over the plurality of grating strips and gaps between the grating strips. Furthermore, metal strips are formed by a metal thin film deposited over the grating strips. During this procedure, a line width of the metal strip depends on the thickness of the metal thin film. This helps to avoid subjecting the metal thin film to a nanoscale high-resolution etching, thereby reducing the etching difficulty and improving the manufacture yield rate. Besides, by forming filling strips over the metal thin film, e.g., in slits of the metal thin film, and removing a metal thin film part connecting adjacent metal strips, the metal strips are disconnected, and thus a final metal grating is formed. In the manufacturing method provided by an embodiment of the present disclosure, the line width of the metal strip in the metal grating is only relevant with the deposition thickness of the metal thin film. Thus, it will not be influenced by the etching accuracy of a metal-etching device. Therefore, the line width of the metal strip can be on the order of several tens of nanometers or even several nanometers, which is helpful for obtaining a high-resolution metal grating.

Steps in the manufacturing method provided by an embodiment of the present disclosure will be explained below in detail.

Figure 5A:
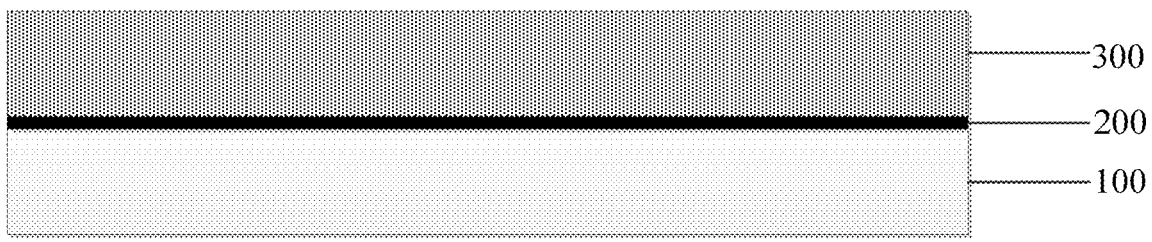
FIGS. 5a-5j are respectively schematic views for a structure at different stages during the manufacture of a metal grating according to an embodiment of the present disclosure.

According to a specific embodiment, in the manufacturing method provided by an embodiment of the present disclosure, as shown in FIG. 5a, in step S401, a peeling layer 200 and an adhesive film layer 300 are formed sequentially on the base substrate 100. Specifically, the peeling layer 200 can be fabricated by using, for example, oxide materials that can be decomposed by laser irradiation. Besides, the thickness of the peeling layer 200 is generally controlled to be about several tens of nanometers. After that, the adhesive film layer 300 is formed on the peeling layer by using materials such as photoresist or resin. Generally, the thickness of the adhesive film layer 300 is controlled to be between 100 nm and 500 nm.

Figure 5B:
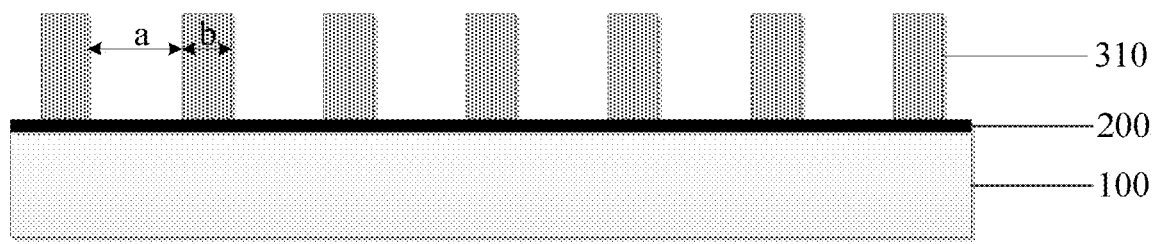

According to a specific embodiment, in the manufacturing method provided by an embodiment of the present disclosure, as shown in FIG. 5b, in step S402, the adhesive film layer 300 is etched to form a plurality of grating strips 310 parallel to each other. Optionally, a width b of each grating strip 310 formed is smaller than a pitch a between adjacent grating strips 310. Moreover, advantageously, a ratio between the width b of each grating strip 310 and the pitch a between adjacent grating strips 310 approximates 1:1. This helps to facilitate subsequent formation of metal strips having a same pitch therebetween, and ensures homogeneity in the grating period of the metal grating.

Figure 5C:
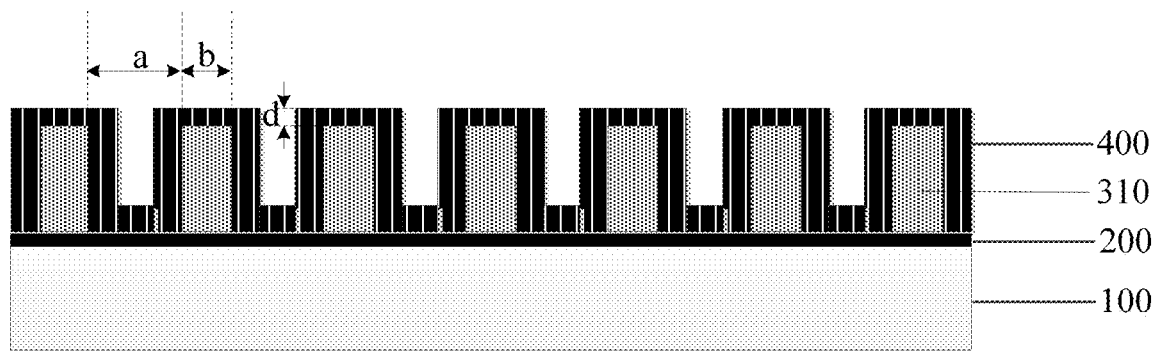
Figure 5D:
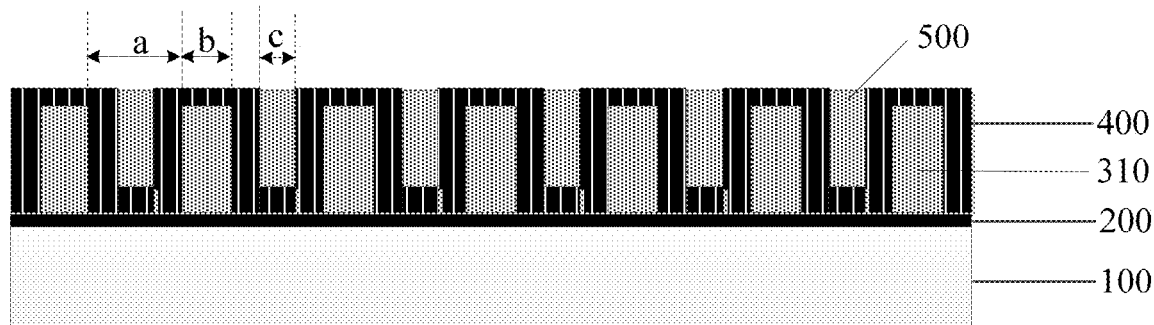

Optionally, in the manufacturing method provided by an embodiment of the present disclosure, as shown in FIG. 5d, when the width b of each grating strip 310 formed is smaller than the pitch a between adjacent grating strips 310, the width b of each grating strip 310 formed is further made equal to a width c of each filling strips 500 formed sequentially. This facilitates subsequent formation of metal strips 410 with the same pitch, and ensures homogeneity in the grating period of the metal grating. According to a specific embodiment, the advantageous effect such as the grating strips 310 and the filling strips having the same width can be achieved by adjusting a ratio relation between the width b of the grating strip 310, the pitch a of adjacent grating strips 310, and the thickness d of the metal thin film 400, e.g., assuming that a−2*d=b.

According to a specific embodiment, in the manufacturing method provided by an embodiment of the present disclosure, as shown in FIG. 5c, in step S403, a metal thin film 400 distributed continuously with a uniform thickness is formed over the plurality of grating strips 310 and the gaps between the grating strips 310. Specifically, the metal thin film 400 can be formed by atomic layer deposition or ion-assisted deposition. As compared with a conventional deposition method such as chemical vapor deposition or physical vapor deposition, atomic layer deposition or ion-assisted deposition for example can ensure that not only metal thin film parts on top of each grating strip, but also metal thin film parts formed on a lateral side of each grating strip (i.e., the parts finally forming the metal strips of the metal grating), have the same thickness. This ensures a same size of each metal strip in the metal grating as formed finally, and facilitates obtaining a metal grating having a more prominent optical performance.

Specifically, the metal thin film 400 can be generally made of Ag, Al, Mo, Cu, and so on. Furthermore, the thickness of the metal thin film 400 deposited in the above manner can be controlled to be between several nanometers and several tens of nanometers. This can achieve good homogeneity. Besides, since the thickness d of the metal thin film 400 is associated with the width of each metal strip (wire) 410 in the metal grating as formed finally, with the manufacturing method provided by embodiments of the present disclosure, metal wires in the resulting metal grating can be reduced onto an order of several tens of nanometers, or even several nanometers.

According to a specific embodiment, in the manufacturing method provided by an embodiment of the present disclosure, as shown in FIG. 5d, in step S404, a filling material, such as filling strip 500, is formed over the metal thin film 400, for example, in recessed slits of the metal thin film 400. Specifically, a resin material with fluidity can be used to fill the recessed slits of the metal thin film, so as to obtain a good filling effect. Besides, in an actual operation, the resin material is not limited to fill only the recessed slits of the metal thin film. For example, the resin material may be left on top of the metal thin film unavoidably. That is, the resin material may be formed on the metal thin film parts in a top portion of the grating strips.

Figure 5E:
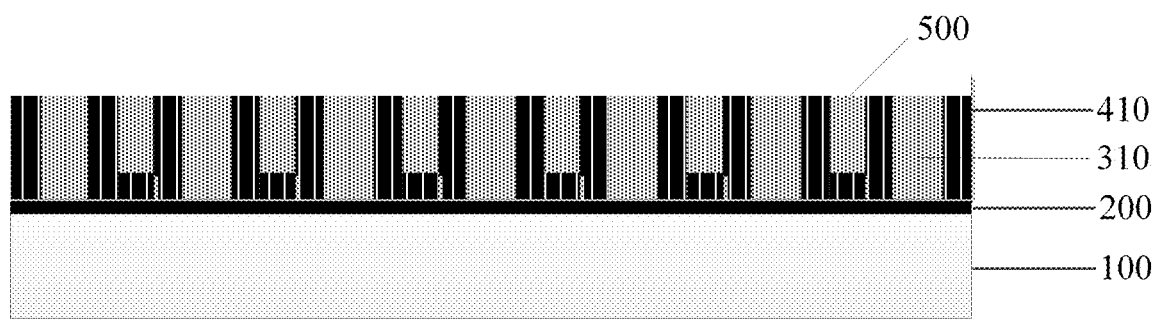

In view of above, according to a specific embodiment, in the manufacturing method provided by an embodiment of the present disclosure, as shown in FIG. 5e, in step S405, top portions of the metal thin film 400 and the filling strips 500 are removed. Specifically, the top portions of the metal thin film 400 and the filling strips 500 can be removed simultaneously by dry etching, so as to form a plurality of metal strips 410 spaced from each other on an upper end and flush with upper ends of the filling strips 500. Besides, the top portions of the metal thin film 400 and the filling strips 500 are removed directly. So, etching devices and etching techniques with high-resolution are not required. In other words, in step S405, the dry etching technique is not influenced by the accuracy of device.

Figure 5F:
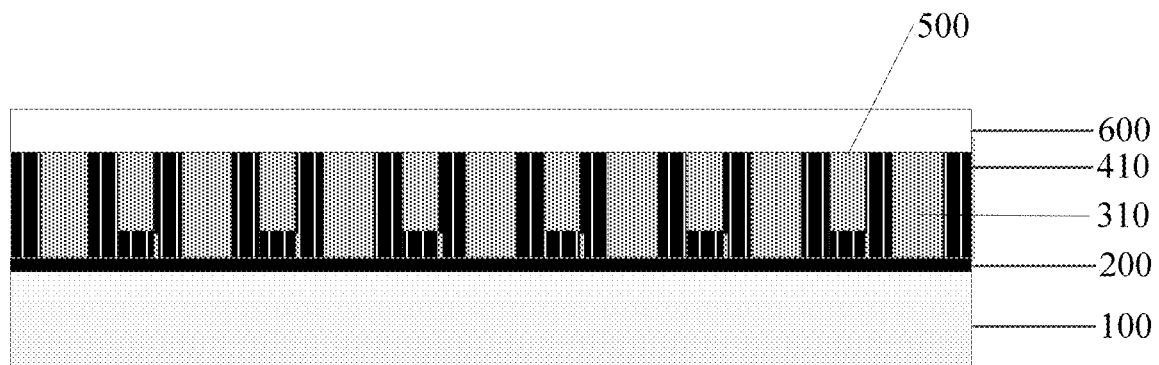

According to a specific embodiment, in the manufacturing method provided by an embodiment of the present disclosure, as shown in FIG. 5f, in step S406, a base layer 600 is formed over the metal thin film 500 and the filling strips 410. Specifically, a coating process can be utilized with the help of materials such as PI or resin on the base layer 600.

Figure 5G:

According to a specific embodiment, in the manufacturing method provided by an embodiment of the present disclosure, as shown in FIG. 5g, in step S407, optionally, after the base substrate 100 is flipped over, the base substrate 100 can be peeled by removing the peeling layer 200. Specifically, this can be done by irradiating the peeling layer 200 with laser from one side of the base substrate 100. In this case, the peeling layer 200 will be decomposed into gases such as hydrogen and oxygen after being heated. Thus, the goal of peeling the base substrate 100 can be achieved.

Figure 5H:
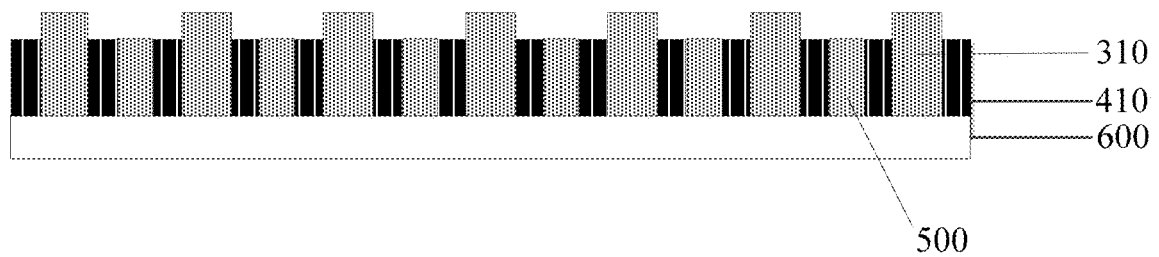
Figure 5I:
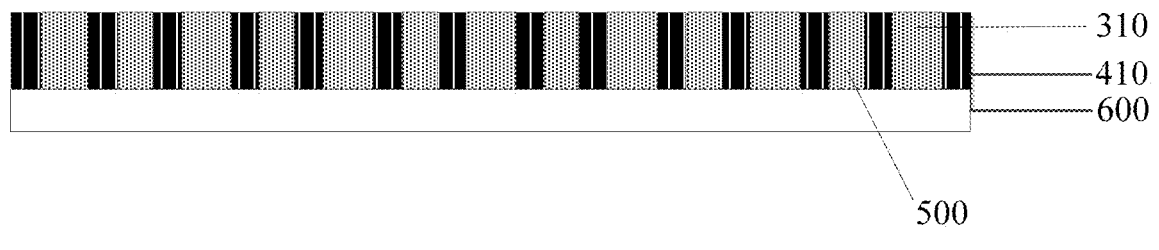

According to a specific embodiment, in the manufacturing method provided by an embodiment of the present disclosure, as shown in FIG. 5h, in step S408, the metal thin film parts connecting two adjacent metal strips 410 at one end are removed. Specifically, the metal thin film parts can be etched by wet etching, and thereby a metal grating can be obtained. In this case, the top portion of the grating strips 310 still protrudes from the metal strips, which is disadvantageous for the surface smoothness of the metal grating as obtained finally. Therefore, advantageously, as shown in FIG. 5i, the top portions of the metal thin film parts and the grating strips 310 are removed simultaneously by dry etching, such that the metal strips 410 and the grating strips 310 are flush with each other on the upper ends. Then, a metal grating having better surface homogeneity is obtained.

Furthermore, in order to improve the surface homogeneity of the manufactured metal grating for connecting the metal grating with other film layer components inside the display panel in a better way, in the manufacturing method provided by an embodiment of the present disclosure, as shown in FIG. 4, the following steps can also be used.

Figure 5J:
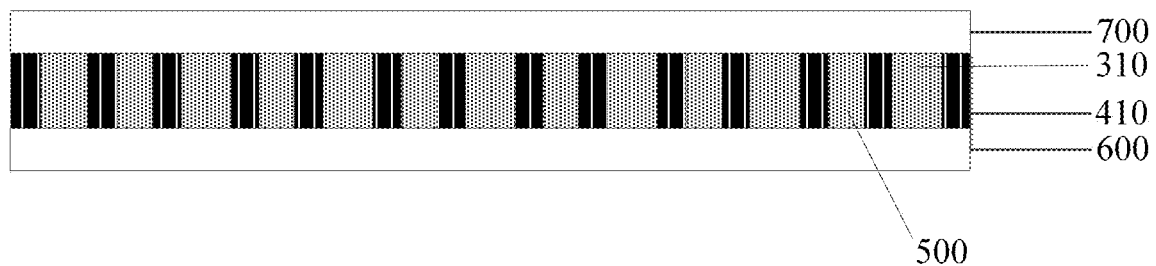

Specifically, in step S409, a planarization layer 700 is formed over the metal grating. As shown in FIG. 5j, a layer of resin greater than about 1 μm can be applied on a surface of the metal grating as a planarization layer 700. In this way, better surface homogeneity of the metal grating can be obtained. Besides, the planarization layer can further function to protect the surface of the metal grating.

According to another aspect of the present disclosure, a metal grating manufactured by the above manufacturing method is further provided in an embodiment. As shown in FIG. 5j, the metal grating can comprise: a base layer; a plurality of metal strips 410 arranged on the base layer 600 and parallel to each other; and grating strips 310 and filling strips 500 arranged alternately between adjacent metal strips 410.

In the metal grating provided by an embodiment of the present disclosure, the line width of the metal strips 410 in the metal grating is only correlated with the deposition thickness of the metal thin film 400. So, it will not be influenced by the etching accuracy of a metal-etching device. In this way, the line width of the metal strips 410 can be controlled on the order of several tens of nanometers, or even several nanometers, which is helpful for obtaining a high-resolution metal grating.

According to a specific embodiment, the metal grating provided by an embodiment of the present disclosure can further comprise, as shown in FIG. 5j, a planarization layer 700 arranged over the metal strips 410, the grating strips 310 and the filling strips 500. The planarization layer 700 can not only endow the surface of the metal grating with better homogeneity, but also function to protect the surface of the metal grating.

Based on a same concept, an embodiment of the present disclosure further provides a display device. The display device can be any product or component having a display function, such as a cellphone, a tablet computer, a television, a display, a notebook computer, a digital photo frame, a navigator and the like. For implementations of the display device, the above embodiments of the metal grating can be referred to, which will not be repeated here for simplicity.

Specifically, an embodiment of the present disclosure provides a display device. The display device can comprise: a display panel; and the metal grating arranged inside the display panel as a polarizer.

Specifically, in the display device provided by an embodiment of the present disclosure, the thickness of the display device can be greatly reduced by using the metal grating as a polarizer and arranging it inside the display panel.

Figure 6A:
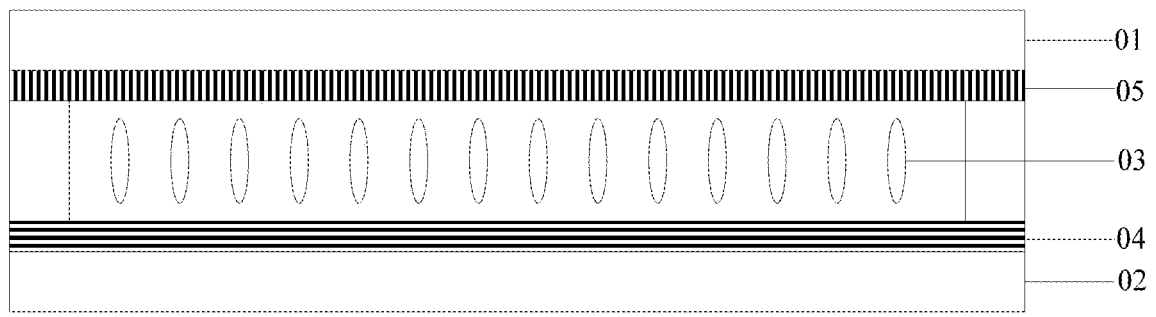
FIGS. 6a and 6b are respectively schematic structure views for a display device according to an embodiment of the present disclosure.

According to a specific embodiment, in the display device provided by an embodiment of the present disclosure, as shown in FIG. 6a, the display panel can be a liquid crystal display panel. Specifically, the liquid crystal display panel comprises: a counter substrate 01 and an array substrate 02 arranged opposite to each other; a liquid crystal layer 03 between the counter substrate 01 and the array substrate 02; and a metal grating. Furthermore, the metal grating comprises: a first metal grating 04 arranged on one side of the array substrate 02 facing the liquid crystal layer 03; and a second metal grating 05 arranged on one side of the counter substrate 01 facing the liquid crystal layer 03, wherein an extension direction of the first metal grating 04 is perpendicular to that of the second metal grating 05. In this way, a polarizer allowing passage of polarized light having a first direction and a second direction respectively is obtained, wherein the first direction and the second direction are perpendicular to each other.

Figure 6B:
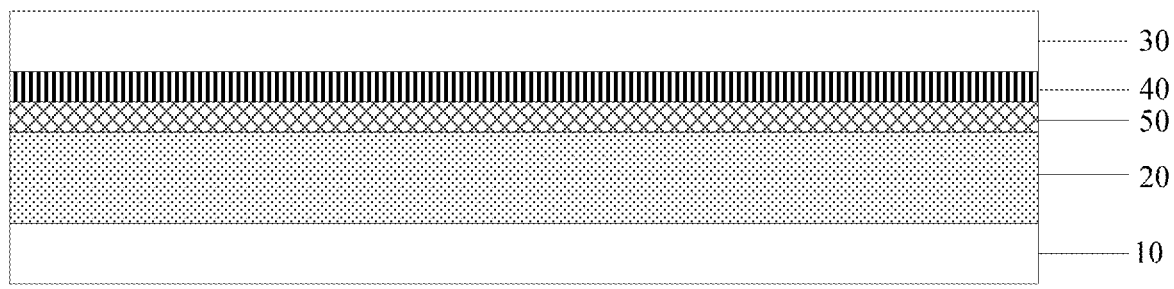

According to a specific embodiment, in the display device provided by an embodiment of the present disclosure, as shown in FIG. 6b, the display panel can further be an organic electroluminescent display panel. The organic electroluminescent display panel can comprise: a base substrate 01; a light emitting device 20 arranged on the base substrate 10; an encapsulation layer 30 covering the light emitting device 20; a metal grating 40; and a quarter-wave plate 50. Specifically, the metal grating 40 is arranged between the encapsulating layer 30 and the light emitting device 20, and the quarter-wave plate 50 is arranged between the light emitting device 20 and the metal grating 40. The quarter-wave plate 50 and the metal grating 40 serving as a circular polarizer cooperate with each other to achieve an anti-reflection function.

Embodiments of the present disclosure provide a manufacturing method for a metal grating, a metal grating, and a display device. Specifically, after a plurality of grating strips are formed in parallel by using an adhesive film layer, a metal thin film distributed continuously with a uniform thickness is formed over the plurality of grating strips and the gaps between the grating strips. Furthermore, optionally, the thickness of the metal thin film is smaller than half of a pitch between adjacent grating strips. In this way, metal strips are formed by depositing a metal thin film, wherein the line width of each metal strip depends on the thickness of the metal thin film. This can avoid subjecting the metal thin film to a nanoscale high-resolution etching, thereby reducing the etching difficulty, and improving the manufacture yield rate. Besides, by forming filling strips in recessed slits of the metal thin film, and removing the metal thin film part connecting adjacent metal strips, the metal strips are disconnected, and thus a final metal grating is formed. The metal grating formed by the above manufacturing method can comprise: a base layer; a plurality of metal strips arranged on the base layer and parallel to each other; and grating strips and filling strips arranged alternately between adjacent metal strips. In such a metal grating, the line width of each metal strip is only correlated with the deposition thickness of the metal thin film. So, it will not be influenced by the etching accuracy of a metal-etching device. Therefore, the line width of the metal strips can be on the order of several tens of nanometers, or even several nanometers, which is helpful for obtaining a high-resolution metal grating.

Obviously, those skilled in the art can make various modifications and variations to the present disclosure without departing from the spirit and scope of the present disclosure. Thus, if modifications and variations to the present disclosure fall within the scope of claims of the present disclosure and the equivalent techniques thereof, the present disclosure is intended to include them too.

The invention claimed is:

1. A manufacturing method for a metal grating, comprising:
   forming a peeling layer and an adhesive film layer sequentially on a base substrate;
   etching the adhesive film layer to form a plurality of grating strips parallel to each other;
   forming a metal thin film covering the plurality of grating strips and gaps between the grating strips, the metal thin film having a uniform thickness;

covering the metal thin film with a filling material;

performing a first topping process on a resulting structure such that an exposed surface comprises grating strips, metal strips and filling strips arranged alternately and flush with each other;

forming a base layer over the grating strips, the metal strips and the filling strips;

peeling the base substrate by removing the peeling layer;

after flipping over said base substrate, performing a second topping process on a resulting structure such that an exposed surface comprises grating strips, metal strips and filling strips arranged alternately and flush with each other, thereby forming a metal grating; and applying a layer of resin greater than about 1 μm on a surface of the metal grating opposite to the base layer as a planarization layer.

2. The manufacturing method according to claim 1, wherein
a thickness of the metal thin film is smaller than half of a pitch between adjacent grating strips.

3. The manufacturing method according to claim 1, wherein
a width of each grating strip is smaller than a pitch between adjacent grating strips.

4. The manufacturing method according to claim 3, wherein
the width of each grating strip is equal to that of each filling strip.

5. The manufacturing method according to claim 1, wherein
the metal thin film covering the plurality of grating strips and the gaps between the grating strips is formed by atomic layer deposition or ion-assisted deposition.

6. The manufacturing method according to claim 1, wherein
the filling material comprises a resin material with fluidity.

7. The manufacturing method according to claim 1, wherein
during the first topping process, top portions of the metal thin film and the filling material are removed simultaneously by dry etching.

8. The manufacturing method according to claim 1, wherein
after the first topping process and prior to the second topping process, every two adjacent metal strips are connected with each other at one end via a metal thin film part.

9. The manufacturing method according to claim 8, wherein
during the second topping process, top portions of the grating strips, the metal strips and the filling strips, as well as the metal thin film parts, are removed simultaneously by dry etching.

* * * * *